United States Patent [19]
Gill et al.

[11] Patent Number: 5,151,760
[45] Date of Patent: Sep. 29, 1992

[54] INTEGRATED CIRCUIT WITH IMPROVED CAPACITIVE COUPLING

[75] Inventors: Manzur Gill, Rosharon; David J. McElroy, Lubbock, both of Tex.

[73] Assignee: Texas Instruments Incorporated, Dallas, Tex.

[21] Appl. No.: 738,004

[22] Filed: Jul. 30, 1991

Related U.S. Application Data

[62] Division of Ser. No. 563,369, Aug. 6, 1990, Pat. No. 5,057,446.

[51] Int. Cl.$^5$ ................. H01L 29/68; H01L 27/02
[52] U.S. Cl. ........................ 357/23.5; 357/51
[58] Field of Search ............... 357/23.5, 51, 59, 45, 357/54

[56] References Cited

U.S. PATENT DOCUMENTS

5,057,886 10/1991 Riemenschneider et al. ..... 357/23.5

Primary Examiner—Mark V. Prenty
Attorney, Agent, or Firm—W. James Brady, III; Lawrence J. Bassuk; Richard L. Donaldson

[57] ABSTRACT

According to the invention, an integrated circuit with improved capacitive coupling is provided, and includes a first conductor (20), a second conductor (16), and a third conductor (22). The second conductor (22) and third conductor (16) are disposed adjacent each other, separated by an insulator region (60). The first conductor (20) contacts the third conductor (16) and extends across a portion of the third conductor (22). The first and third conductors are separated by an insulator region (54). A voltage applied to first conductor (20) and the second conductor (16) is capacitively coupled to third conductor (22).

25 Claims, 6 Drawing Sheets

FIG. 11

INTEGRATED CIRCUIT WITH IMPROVED CAPACITIVE COUPLING

This is a division of application Ser. No. 07/563,369, filed Aug. 6, 1990 and now U.S. Pat. No. 5,057,446.

TECHNICAL FIELD OF THE INVENTION

The present invention relates generally to integrated circuits, and more particularly to an integrated circuit with improved capacitive coupling.

BACKGROUND OF THE INVENTION

Currently two classes of "flash" or bulk erasable EEPROMS using a floating gate structure are available: (1) those which require two power supplies, one for programming and another for reading; and (2) those employing a single relatively low voltage supply for all the programming, erasing and reading operations. When two power supplies are used, typically, a 12-volt power supply is used for programming and erasing, and a 5-volt power supply is used during read operations.

Devices employing a single, relatively low voltage power supply are disclosed in pending U.S. application Ser. Nos. 07/219,528 filed Jul. 15, 1988, now abandoned 07/219,529 filed Jul. 15, 1988, now abandoned and 07/219,530 also filed Jul. 15, 1988, now abandoned. Programming and erasing are accomplished by Fowler-Nordheim tunneling through a thin dielectric window. Capacitive coupling between control gates and floating gates in the array is improved by extending the floating gate onto field oxide regions adjacent each cell. The extended floating gates provide increased coupling area with the corresponding overlying control gates.

Improved capacitive coupling allows programming and erasing at reduced control gate voltages. Additionally, during the read cycle, improved reading currents can be achieved. This is due to the fact that as the capacitive coupling is improved, a greater percentage of the voltage applied to the control gate can be coupled to the floating gate. This relationship is represented by the equation:

$$V_f = K V_g \tag{1}$$

where
$V_f$ = voltage coupled to the floating gate.
$V_g$ = voltage applied to the control gate.
$K$ = capacitive coupling ratio.

The capacitive coupling ratio in floating gate structure non-volatile memories, is defined by:

$$K = \frac{C_1}{C_1 + C_T} = \frac{1}{1 + C_T/C_1}, \tag{2}$$

where:

$$C_T = C_2 + C_3 + C_4 + C_5,$$

and
$C_1$ = capacitance between control gate and the floating gate.
$C_2$ = capacitance between floating gate and the source.
$C_3$ = capacitance between floating gate and the drain.
$C_4$ = capacitance between floating gate and the channel.
$C_5$ = capacitance between floating gate and the substrate.

From equations (1) and (2), it can be seen that if $C_1$, the capacitance between the floating gate and the control gate, can be improved, then the capacitive coupling ratio will also be improved. Capacitance $C_1$ can be improved if the coupling area between the control gate and the floating gate is increased.

Thus, a need has arisen for an electrically-erasable and programmable read-only memory cell with increased coupling area between the control gate and the floating gate. Such a cell will have the significant advantage of being programmable and erasable at reduced control gate voltages. Further, during the read cycle, improved read currents can be achieved for a given control gate voltage.

SUMMARY OF THE INVENTION

According to the invention, an integrated circuit with improved control gate to floating gate capacitive coupling is provided, and includes first, second and third conductors. The second and third conductors are disposed adjacent each other, separated by an insulator layer. The first conductor contacts the second conductor and extends across a portion of the third conductor. The first and third conductors are also separated by an insulator layer. A voltage applied to the first and second conductors is capacitively coupled to the third conductor.

In one embodiment using a merged pass gate, an electrically-erasable, electrically-programmable read-only memory cell is provided at a face of a semiconductor layer of a first conductivity type. A source region and a drain region are formed in the face to be of a second conductivity type opposite the first conductivity type. The source region and the drain region are separated by a channel area. A merged pass gate conductor is then formed which extends over a portion of the channel area. Next, a floating gate is formed which overlies a portion of the channel area and insulatively overlies a portion of the merged pass gate. A control gate is formed which directly contacts the merged pass gate and which insulatively overlies the floating gate. This embodiment provides greater surface area insulatively adjacent the floating gate such that the capacitive coupling between control gate and floating gate is increased.

In a second embodiment, the merged pass gate is eliminated and the floating gate controls the entire channel area. In this embodiment, a first and a second control gate fold around the floating gate in a region overlying thick insulators formed overlying and adjacent to the drain region, providing additional surface area for improved capacitive coupling.

The present invention presents distinct advantages over prior art integrated circuits. The first and second conductors in combination provide increased surface area adjacent the third conductor, allowing an increase in capacitive coupling. When used in an electrically programmable, electrically erasable read-only memory cell, the improvement in capacitive coupling reduces the voltages required to discharge and charge the floating gate.

BRIEF DESCRIPTION OF THE DRAWINGS

Other aspects of the invention and their advantages will be discerned when one refers to the following detailed description as taken in conjunction with the drawings, in which like numbers identify like parts and in which.

DETAILED DESCRIPTION OF THE INVENTION

Figure 1:
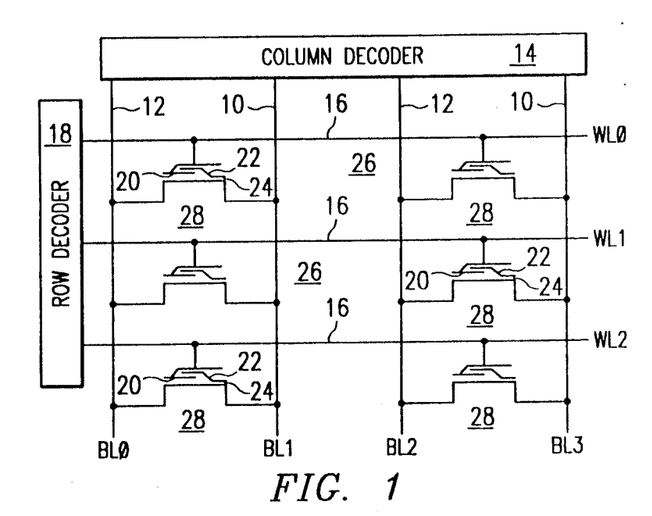
FIG. 1 is an electrical schematic of a small section of an array of memory cells with improved capacitive coupling according to the invention.

An electrical schematic diagram of an array of electrically erasable, programmable read-only memory (EEPROM) cells according to the invention are shown in FIG. 1. Each column of cells is provided with a source region 10 and a drain region 12 (bitlines) which are coupled to an associated column decoder 14. Each row of cells is provided with a control gate 16 (wordline) connected to an associated row decoder 18. Each cell has a merged pass gate 20, a floating gate 22 and a thin insulator tunneling window 24 associated with floating gate 22. Adjacent columns of cells are separated by thick field oxide regions 26 and adjacent rows of cells by thick field oxide regions 28. As is shown, the merged pass gate 20 and the control gate 16 together extend over and under a portion of the floating gate 22 to provide improved capacitive coupling.

The fabrication of an EEPROM cell according to the invention will be described first, followed by the operation of the array of cells depicted in FIG. 1.

Figure 2:
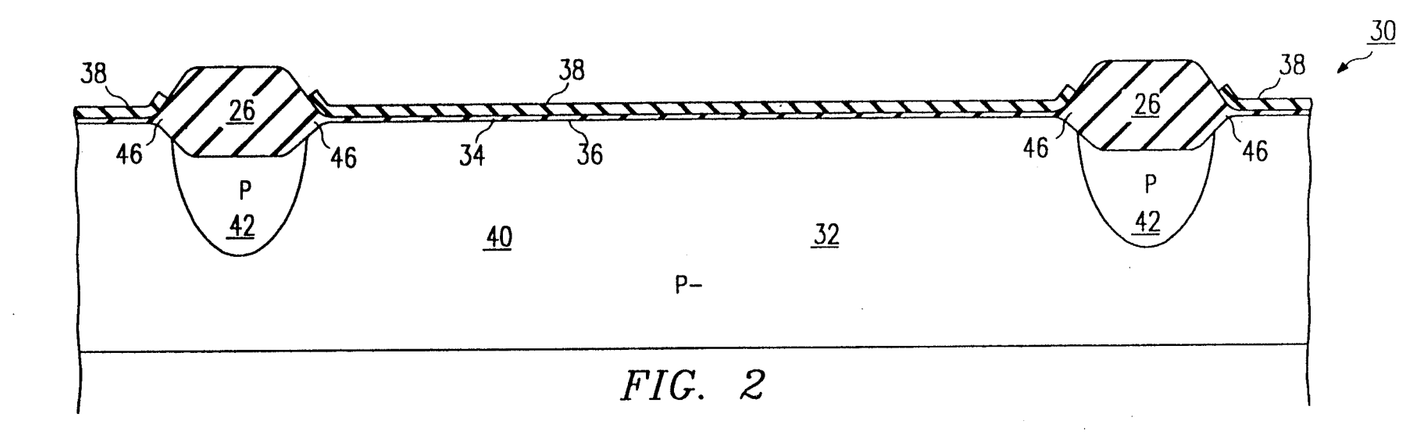
FIGS. 2 through 7 are greatly enlarged schematic elevational sectional views of a semiconductor layer showing progressive stages in the fabrication of a first embodiment of an EEPROM cell with improved capacitive coupling according to the invention.

Referring to FIG. 2, a semiconductor substrate or layer 30 is shown having a (p−) epitaxial layer 32 grown thereon. A layer 34 of oxide is deposited or grown on the a surface 36 of (p−) region 32. This is followed by the deposition of a nitride layer 38 on top of the oxide layer 34. The nitride layer 38 is patterned and etched to define an active device area 40 over which it resides, which will later include source region 10, drain region 12 and a channel region of the cell.

The fabrication process detailed herein omits steps necessary for the co-fabrication of a plurality of CMOS logic transistors cited in the periphery of the chip. Since the techniques for fabricating such transistors are conventional, they will not be described here.

Figure 8:
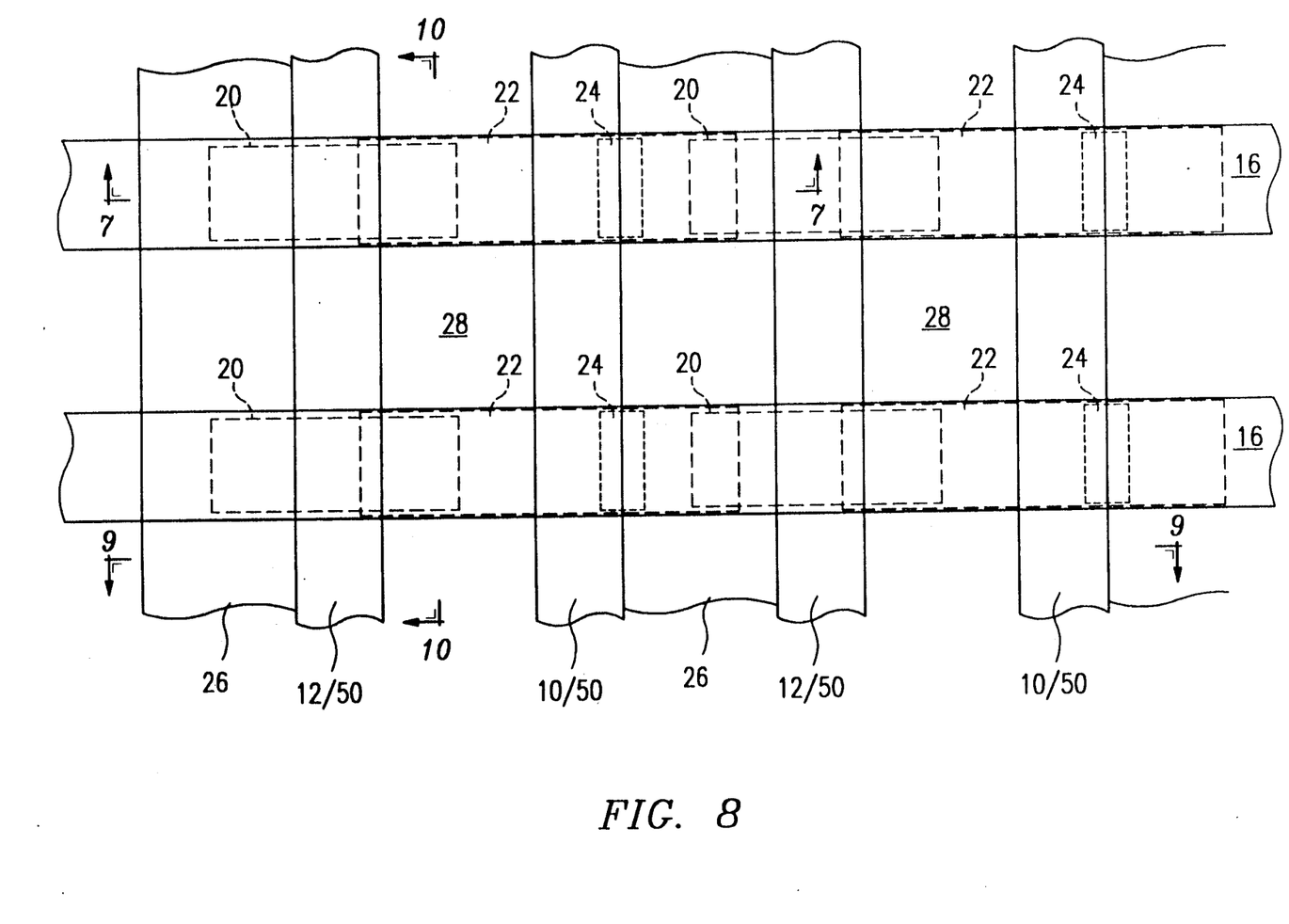
FIG. 8 is a plan view of a portion of a memory cell array, the sectional view of FIG. 7 taken substantially along the line 7—7.
Figure 9:
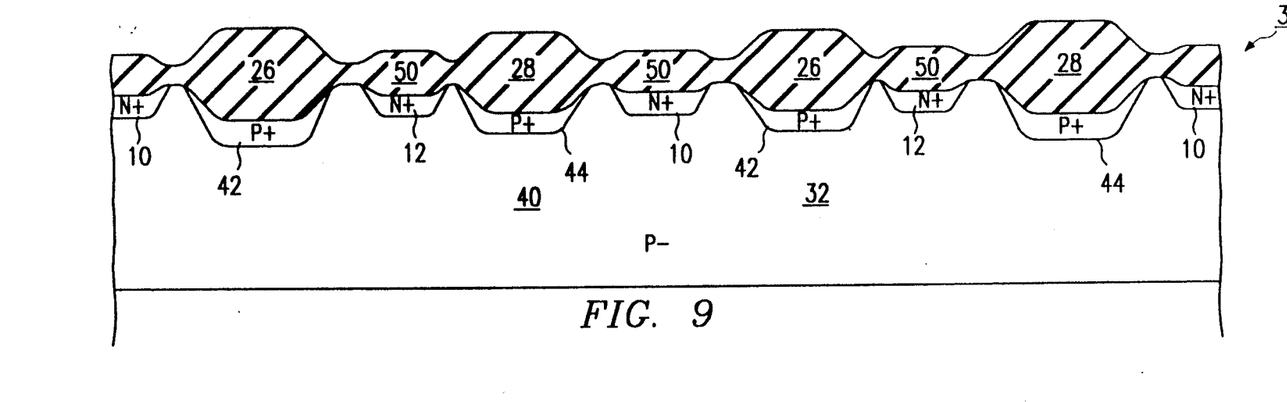
FIG. 9 is a sectional view taken substantially along line 9—9 of FIG. 8.

A boron implant at a dose of approximately $8 \times 10^{12}$ cm$^{-2}$ is performed to create (p) channel stop regions 42 and 44 (for channel stop region 44, see FIGS. 8 and 9). Then, thick field oxide regions 26 and 28 (for field oxide region 28, see FIGS. 8 and 9) are thermally grown using a localized oxidation process to a thickness of approximately 9000 Angstroms by exposing the substrate to steam at about 900° C. for several hours, using any of several conventional techniques. The thermal oxide regions 26 grow beneath the edges of the adjacent nitride layers 38, creating bird's beaks 46 instead of sharp transitions.

Figure 3:
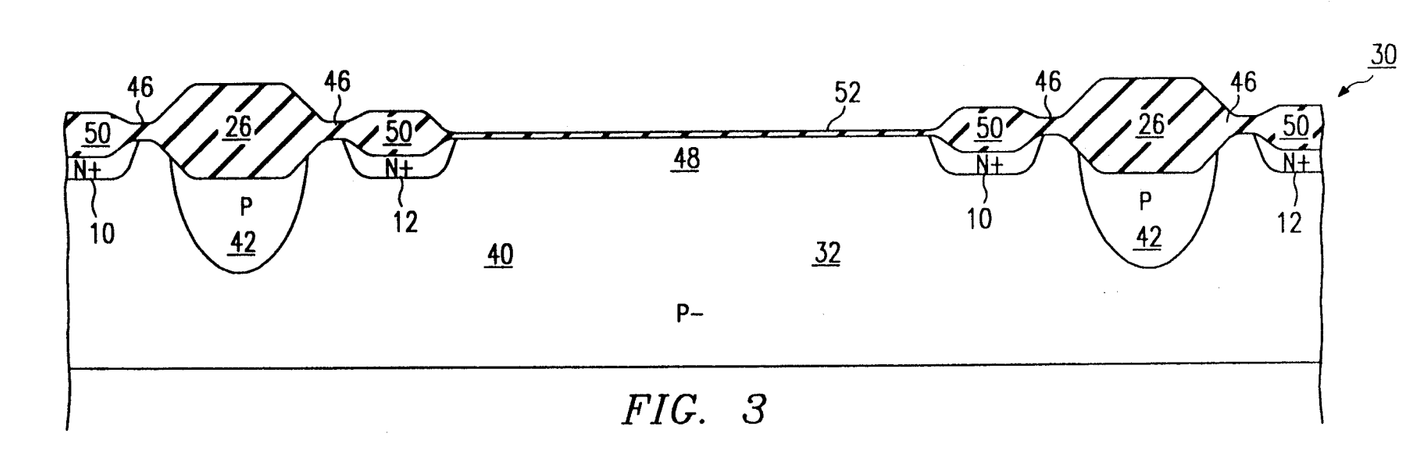

Referring next to FIG. 3, nitride layer 38 and oxide layer 34 are removed. A layer (not shown) of photoresist is deposited and patterned to act as an implant mask for an arsenic implant at a dose of about $6 \times 10^{15}$ cm$^{-2}$ and at an energy of about 130 KeV. This implant creates a source region 10 and a drain region 12, spaced by a channel region 48.

Following the implant of the source region 10 and the drain region 12, and conventional clean up, another thermal step is performed with steam at 800°–900° C. to differentially grow oxide regions 50. Thick oxide regions 50 will be grown to a thickness of approximately 2500 to 3500 Angstroms. At the same time, a thinner oxide layer 52 is formed across channel area 32, and may have a thickness at this point of approximately 250–300 Angstroms. An implant process may be performed to adjust the threshold voltages $V_T$ of structures formed in the region of gate oxide 52. Oxide regions 50 grow at a faster rate than the thin oxide layer 52 because of the arsenic impurity in source and drain regions 10 and 12.

Figure 4:
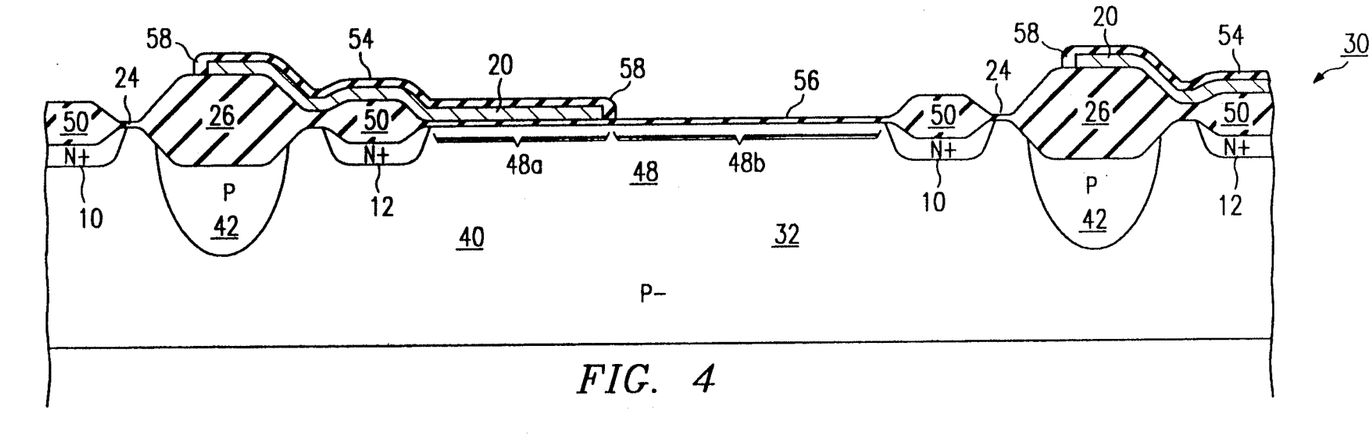

Referring next to FIG. 4, a layer 20 of polycrystalline silicon (polysilicon) is deposited to a thickness of approximately 3500 Angstroms. The polysilicon layer 20 (also known as the "poly 1" layer) is heavily doped to render it conductive. This may be accomplished, for example, by applying an (n+) dopant the polysilicon layer 20 after it has been deposited. This poly layer 20 is future merged pass gate 20.

A relatively thin layer of oxide/nitride sandwich (not shown) is next deposited across the surface of poly 1 layer 20. The oxide/nitride layer and poly 1 layer 20 are then patterned and etched to form a merged pass gate 20 using a conventional process. A portion of merged pass gate 20 extends over a portion 48a of channel area 48. During the process of defining the boundaries of merged pass gate 20, oxide layer 52 is removed in an area 48b of channel area 48 over which a future floating gate will be formed.

An oxidation process is then performed to convert the oxide/nitride overlying poly 1 layer 20 into an oxide/nitride/oxide (ONO) layer 54. During this oxidation process, a first gate oxide 56 is grown in area 48b of channel area 48 which was exposed during the etching process. Additionally, sidewall oxides 58 are formed during this oxidation process at the ends of poly 1 layer 20. The oxide 56 may be then implanted to set the threshold voltage of floating gate structure.

As described in patent application Ser. No. 07/219,529, tunneling windows 24 are next formed in the oxide in the transition areas 46 (dimple) adjacent the source 10. The formation of dimple region 46 has been discussed in co-pending patent application Ser. No. 07/219,529 (This is done by etching through the oxide over the transition area 46 to the silicon using photoresist as a mask and then regrowing a thinner oxide for the tunneling windows. This will create thin oxide tunneling windows 24 which are approximately 100 Angstroms thick. At the time that this oxidation occurs, the gate oxide layer 56 will grow to approximately 350 Angstroms depending on its thickness before this step. A light phosphorous implant is preferably employed through tunnel window 24 to improve the field plate breakdown of the tunnel diode and the operation of the cells. The width of tunnel window 24 may be controlled by varying the length of time for the etch through transition areas 46.

Figure 5:
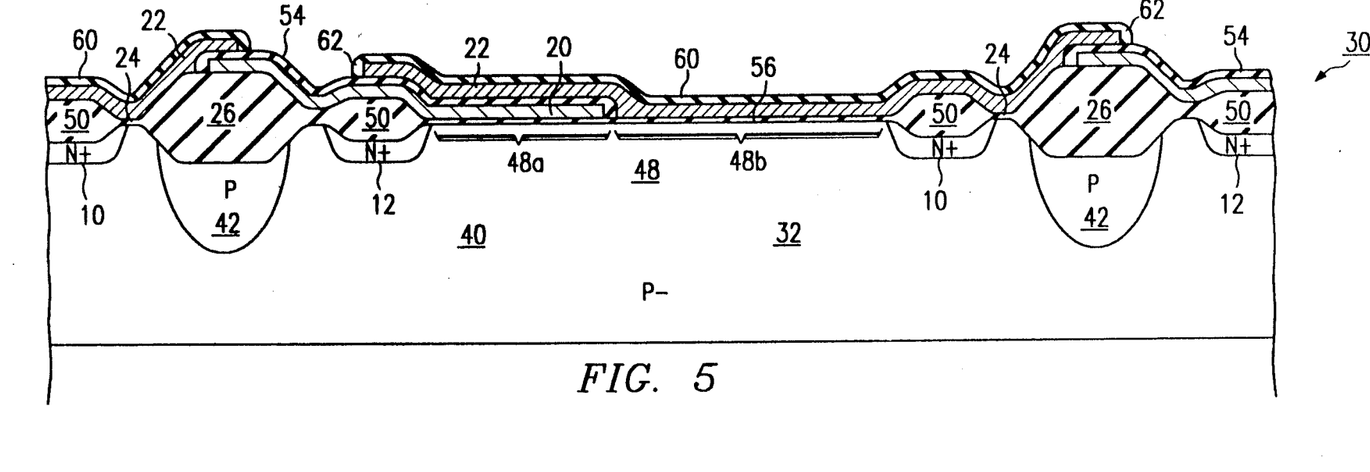

Referring next to FIG. 5, a second polycrystalline silicon layer 22 ("poly 2") is next deposited over the face of the slice and is heavily doped to be (n+). A layer of oxide/nitride sandwich (not shown) is then formed across the surface of poly 2 layer 22. The sandwich consisting of the oxide/nitride layer and poly 2 layer 22 is then etched to define a floating gate 22. Floating gate 22 overlies gate oxide 56, tunneling window 24, and a portion of merged pass gate 20. During the process of etching poly 2 layer 22, portions of ONO layer 54 left exposed are also etched away.

The oxide/nitride overlying the remaining portion of poly 2 layer 22 is then converted into an oxide/nitride/oxide (ONO) insulator layer 60 by oxidation. During this process, oxide is formed over the remaining exposed portions of ONO layer 54. Sidewall oxides 62 are formed at the ends of floating gate 22 during the oxidation process.

Alternatively, following the deposition and doping of poly 2 layer 22, poly 2 layer 22 may be patterned and etched to define floating gate 22. The formation of sidewall oxides 62 are then formed followed by the formation of oxide/nitride/oxide 60 using conventional processes.

Figure 6:
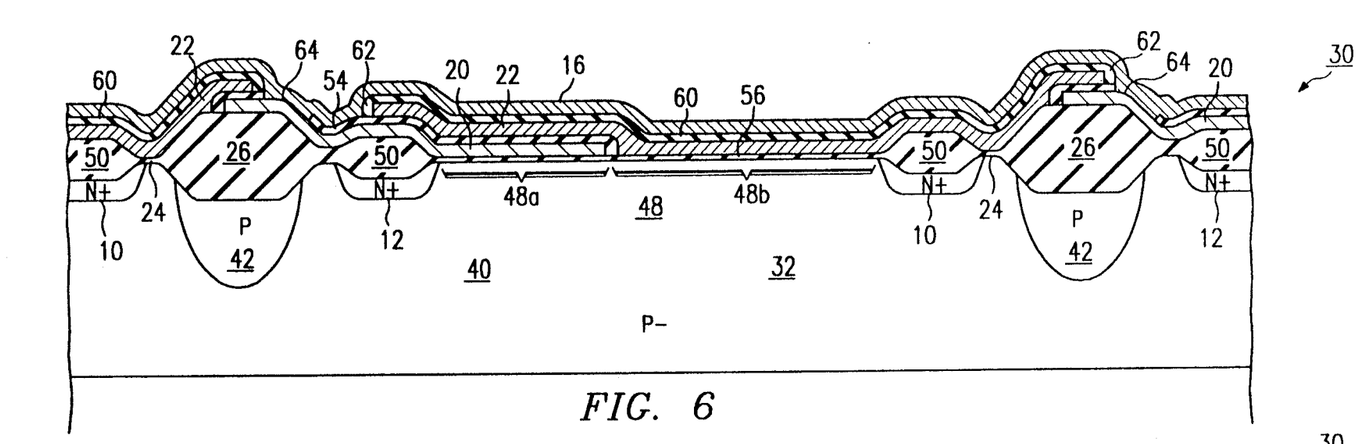

Referring next to FIG. 6, a contact area 64 over a portion of poly 1 layer 20 is patterned (not shown) and the ONO layer 54 is etched away, followed by a conventional clean up.

A third polycrystalline silicon layer 16 ("poly 3") is deposited over the face of the slice and is heavily doped to be (n+). Poly 3 layer 16 directly contacts poly 1 layer 20 through contact opening 64 but remains isolated from poly 2 layer 22 by ONO layer 60 and sidewall oxides 62.

A stacked etch of (1) the third polyconductor 16, (2) interlevel insulator 60, (3) the floating gate 22, (4) interlevel insulator layer 54, and (5) merged pass gate 20, is performed. This stack etch defines a plurality of elongated wordline conductors (control gates) 16 that run substantially parallel to each other in an x-direction and are spaced apart from one another in a y-direction. This same stacked etch separates and defines the floating gate conductors 22 and merged pass gate conductors 20 in a y-direction. Peripheral logic CMOS devices (not shown) may be completed after this step.

The merged pass gate 20 and control gate 16 corresponding to each cell "fold around" a portion of floating gate 22 essentially forming a single control gate with increased surface area adjacent floating gate 22. The increased adjacent area improves the capacitive coupling between merged pass gate 20 and control gate 16 on the one hand, and the floating gate 22 on the other hand.

Figure 7:
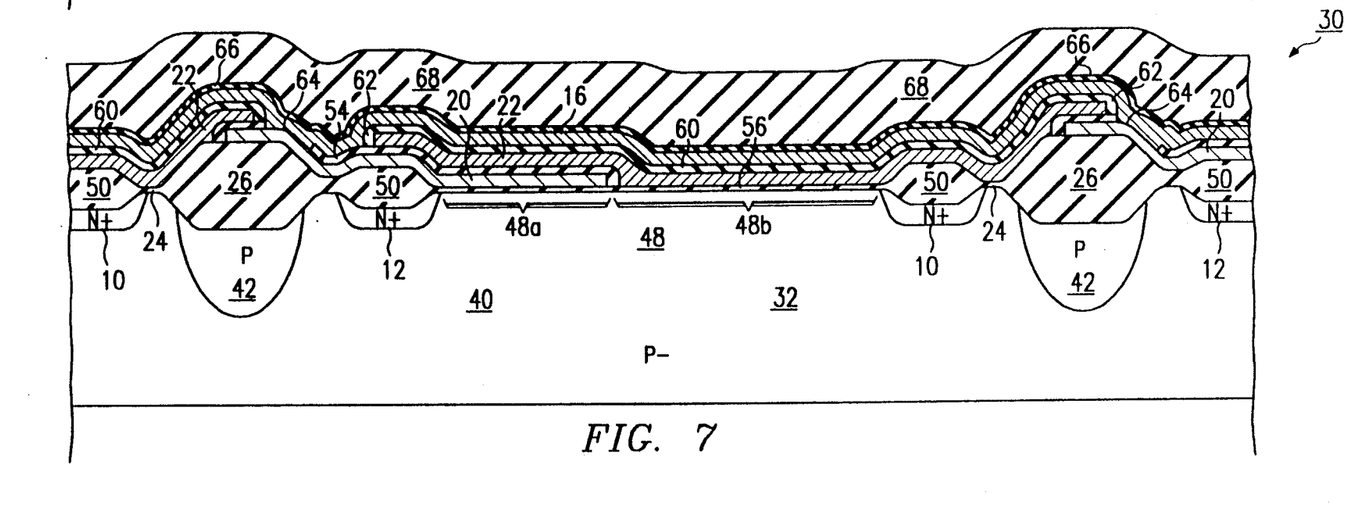

Referring next to FIG. 7, an oxide layer 66 is grown on the sides and top of the stack for enhanced data retention. A borophosphosilicate glass (BPSG) layer 68 has been deposited over the face of the wafer. Off-array contacts (not shown) are made through the BPSG layer 68, as are on-array contacts (not shown) that are made from metal bitlines (not shown) to respective diffused regions 10 and 12 periodically in a y-direction. The metal bitlines are formed on the BPSG layer 68 to run over and be parallel to respective diffused regions 10 and 12.

Referring next to FIG. 8, a plan view of an EEPROM memory cell array is shown, with the sectional view shown in FIG. 6 taken substantially along line 7—7 of FIG. 8. FIG. 8 only depicts a portion of the memory array; selected structure of the array, such as metallization, has been omitted for the sake of clarity.

The source diffused regions 10 and drain regions 12 are elongated diffused bitlines that run in a vertical (y) direction in FIG. 8. These source and drain regions are buried under oxide regions 50. Merged pass gates are shown at 20 and floating gates at 22.

Two control gate conductors 16 are shown. Control gate conductors 16 are elongated in a horizontal (x) direction, and each form a word line for a row of cells.

Figure 10:
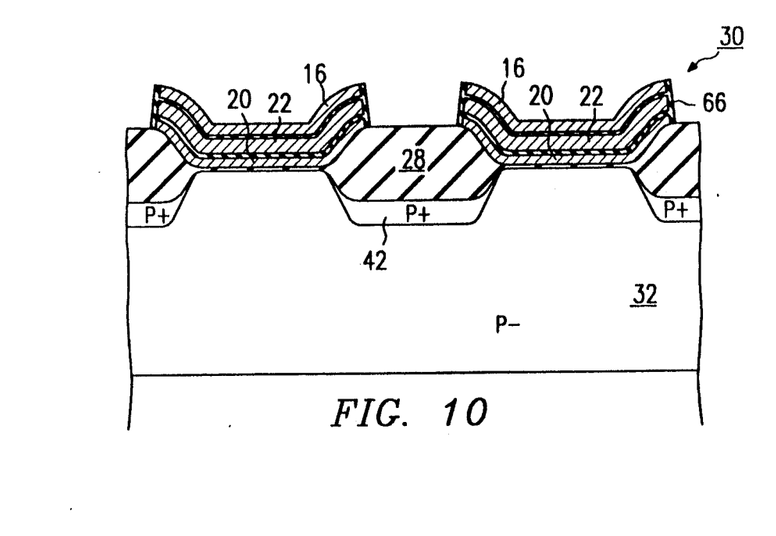
FIG. 10 is a sectional view of FIG. 7 taken substantially along line 10—10 of FIG. 8.

FIG. 9 is a sectional view taken substantially along line 9—9 of FIG. 8, while FIG. 10 is a sectional view taken substantially along line 10—10 of FIG. 8. The exposed edges of poly 1 layer 20, floating gate 22, and control gate 16 are passivated with oxide 66 as shown in FIG. 10.

Figure 11:
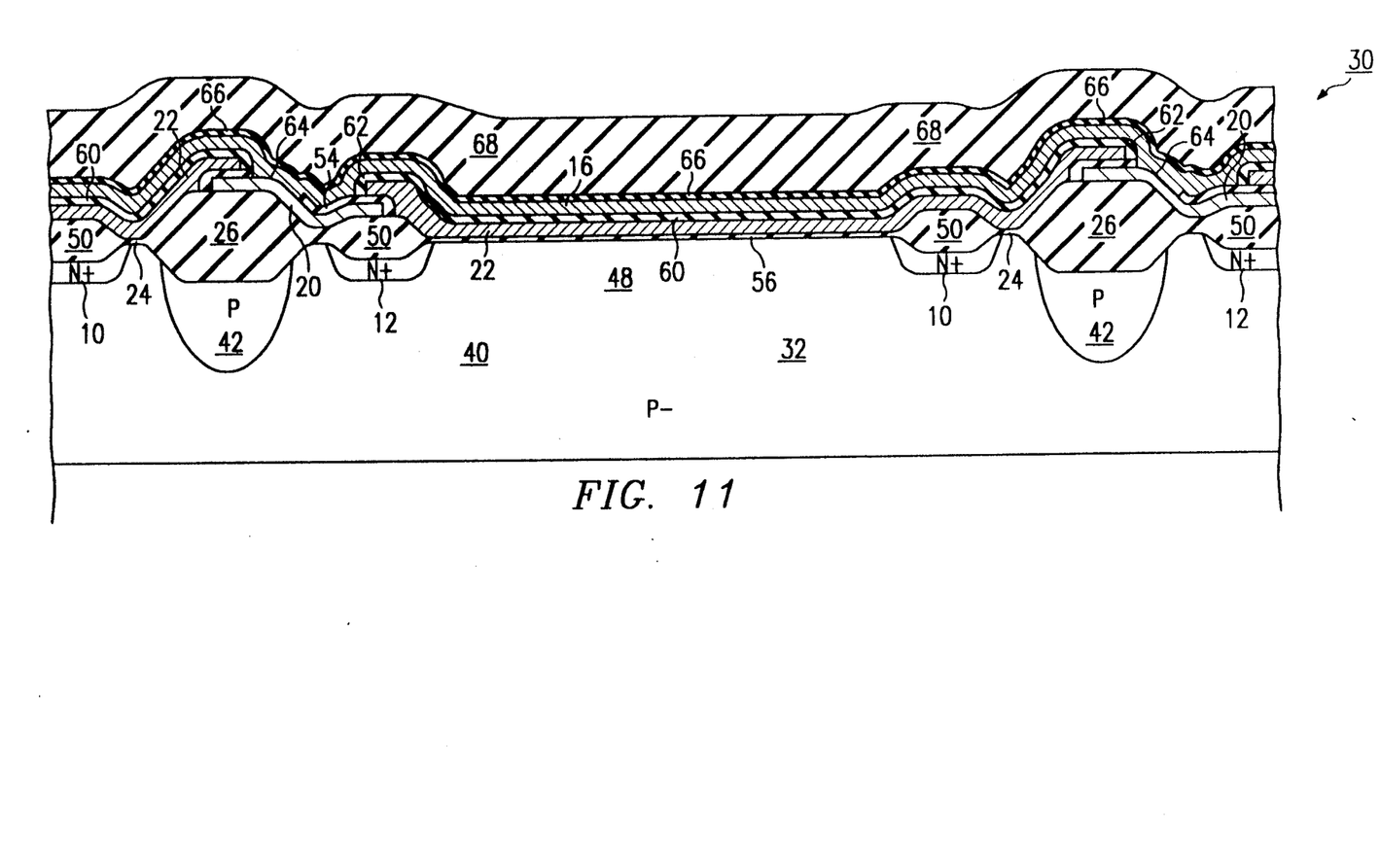
FIG. 11 is a sectional view of a complete memory cell according to a second embodiment, FIG. 11 being similar to the sectional view of FIG. 7 taken substantially along line 10—10 of FIG. 8.

In FIGS. 7 and 8 a merged transistor or "1½T" cell is depicted which has a merged pass gate 20 controlling a portion of channel area 48. Floating gate 22 controls the remaining portion of channel area 48. FIG. 11 in contrast depicts an alternate embodiment or a "1T" cell in which floating gate 22 controls the channel area 48 along the entire length between source region 10 and drain region 12. Poly 1 layer 20 does not extend into the channel area 48 as before, and forms a first control gate 20 rather than a merged pass gate 20. First control gate 20 and control gate 16 now wrap around an edge of floating gate 22 in area overlying differential oxide layer 50 and thick oxide region 26.

The present invention is not limited to the case where poly 1 conductor 20 and control gate 16 "fold" around the ends of floating gate 22 in the areas overlying oxide regions 26 and 50 which define the bitline boundaries of each cell. Further improvement can be achieved by also "folding" poly 1 conductor 20 and control gate 16 around the sides of floating gate 22 along the wordline boundaries of channel area 48 of the cell. This can be realized by forming poly 1 conductor as a sheet extending across each cell and then etching an aperture to expose channel areas 48 and areas for the formation of tunneling windows 24. Additional sidewall oxides will be required along the sides of floating gate 22 in order to prevent shorting with control gate 16 and poly 1 conductor 20 as folded along the edges of the channel areas 48.

Operation of the memory cells depicted in FIG. 1 can now be described, using cell (1,1) as an example.

In the write or program mode, column decoder 14 applies a low voltage $V_{ss}$ (approximately 0 volts) or ground to the source column 10 of the selected cell, in this case labeled BL1. Column decoder 14 applies a voltage $V_{aux1}$ (approximately 7 V) to the deselected source columns 10, in this case BL3. Column decoder 14 allows all drain columns 12 to float, in this case BL0 and BL2. Row decoder 18 applies a high voltage $V_{gg}$ (+12 to +18 volts) to the selected row (wordline), in this case designated WL1, while a lower voltage $V_{aux2}$ (approximately +7 volts) is applied to the deselected rows, in this case WL0 and WL2. The voltage differences created between selected source 10 and floating gate of selected control gate 16 result in floating gate 22 being charged by Fowler-Nordheim tunneling.

To read cell (1,1), column decoder 14 applies a positive voltage $V_{rd}$ (approximately +1.5 volts) to selected drain column (bit line) BL0. All source columns 10 are brought to $V_{ss}$ (approximately 0 volts) by column decoder 14. Row decoder 18 applies a positive voltage $V_{se}$ (approximately +5 volts) to selected row (wordline) WL1 and a low voltage (either ground or $V_{ss}$) to deselected rows WL0 and WL2.

In a first mode of flash or bulk erasing, column decoder 14 applies a positive voltage $V_{dd}$ (approximately +5 volts) to all source columns 10 (bitlines). Column decoder 14 allows all drain columns 12 (bitlines) to float. Row decoder 18 applies a high negative voltage $-V_{ee}$ (−8 to −12 volts) to all rows (wordlines) 16, in this case WL0, WL1 and WL2. The resulting voltage differences cause a removal of charge from floating gates 22 through Fowler-Nordheim tunneling, erasing the array.

In a second mode of flash or bulk erasing, column decoder 14 applies a large positive voltage $V_{ee}$ (approximately +12.5 volts) to all source columns 10 (bitlines). Column decoder 14 allows all drain columns (bitlines) 12 to float. Row decoder 18 applies a small voltage (approximately 0 volts) to all rows (wordlines) 16, in this case, WL0, WL1 and EL2. The resulting voltage differences cause discharge of floating gates 22 through Fowler-Nordheim tunneling, erasing the array.

In summary, the effective overlap area between control gate 16 and floating gate 22 over thick oxide regions 26 can be increased resulting in increased capacitive coupling between control gate 16 and floating gate 22. The increase in coupled surface area by folding control gate 16 around floating gate 22, helps improve the transfer of charge to and from the floating gate 22 when a voltage is applied to control gate 16.

While preferred embodiments of the invention and their advantages have been set forth in the above-detailed description, the invention is not limited thereto, but only by the scope and spirit of the appended claims.

What is claimed is:

1. A memory cell, formed at a face of a semiconductor layer of a first conductivity type, comprising:
    a source region of a second conductivity type opposite that of said first conductivity type, formed at said face;
    a drain region of said second conductivity type formed at said face and spaced from said source region by a channel area;
    a merged pass gate conductor extending over a portion of said channel area;
    a floating gate conductor, a first portion of said floating gate conductor insulatively adjacent a portion of said merged pass gate conductor, a second portion of said floating gate conductor insulatively adjacent a portion of said channel area;
    a control gate conductor, said control gate conductor contacting said merged pass gate conductor and disposed insulatively adjacent said floating gate conductor;
    first insulator regions overlying said respective source and drain regions; and
    second insulator regions adjacent said source and drain regions, said second insulator regions remote from said channel area, said merged pass gate conductor extending over said first insulator region overlying said drain region and over a portion of said second insulator region adjacent said drain region.

2. The memory cell of claim 1, wherein an edge of said floating gate conductor is insulatively disposed between portions of said merged pass gate and control gate conductors.

3. The memory cell of claim 1, wherein said floating gate conductor extends over said first insulator region overlying said source region.

4. The memory cell of claim 3, wherein said floating gate conductor extends over a portion of said second insulator region adjacent said source region.

5. The memory cell of claim 4, wherein said first portion of said floating gate conductor is disposed insulatively adjacent portions of said merged pass gate conductor extending over said first insulator region overlying said drain region.

6. The memory cell of claim 4, wherein said first portion of said floating gate conductor is disposed insulatively adjacent portions of said merged pass gate conductor formed along wordline boundaries of said channel area.

7. The memory cell of claim 1, wherein said first portion of said floating gate conductor is disposed insulatively adjacent portions of said merged pass gate conductor extending over said first insulator region overlying said drain region and portions of said merged pass gate conductor formed along wordline boundaries of said channel area.

8. A memory cell, formed at a face of a semiconductor layer of a first conductivity type, comprising:
    a source region of a second conductivity type opposite that of said first conductivity type, formed at said face;
    a drain region of said second conductivity type formed at said face and spaced from said source region by a channel area;
    a first control gate conductor overlying said face remote from said channel;
    floating gate conductor, a first portion of said floating gate conductor insulatively adjacent a portion of said first control gate conductor, a second portion of said floating gate conductor insulatively adjacent the entire length of said channel area between said source region and said drain region; and
    a second control gate conductor, said second control gate conductor contacting said first control gate conductor and disposed insulatively adjacent said floating gate conductor.

9. An array of memory cells formed in columns and in rows at an angle to said columns, at a face of a semiconductor layer of a first conductivity type, comprising:
    for each column, an elongated drain region of a second conductivity type opposite said first conductivity type;
    for each column, an elongated source region of said second conductivity type, said source region formed substantially in parallel to said drain region and spaced therefrom by a channel area;
    for each column, first and second insulator regions, said first insulator region overlying said drain region and said second insulator region overlying said source region;
    a plurality of third insulator regions, each third insulator region formed between the drain region of a column and the source region of an adjacent column;
    for each cell, a merged pass gate, a portion of said merged pass gate insulatively overlying a first portion of said channel area, the merged pass gates for cells in each column extending over the first insulator region of that column and a portion of the third insulator region formed between the drain region of that column and the source region of an adjacent column;

for each cell, a floating gate, a first portion of said floating gate insulatively adjacent said merged pass gate, a second portion of said floating gate insulatively adjacent a second portion of said channel area; and for each row, a control gate, said control gate insulatively adjacent said floating gates in said row and directly coupled to said merged pass gates in said row.

10. The array of claim 9, wherein for each cell, said floating gate extends over portions of said merged pass gate overlying said firt insulator region.

11. The array of claim 9, wherein for each cell, said merged pass gate contacts said control gate in an area above said third insulatro region formed between the drain region of an associated column and the source region on an adjacent column.

12. The array of claim 9, wherein for each cell, said floating gate extends over said second insulator region and a portion of a third insulator region formed between the source region of an associated column and the drain region of an adjacent column.

13. The memory cell of claim 8, further comprising;
first insulator regions overlying said source and drain regions, said first control gate conductor adjacent said first insulator region overlying said drain region.

14. The memory cell of claim 1, further including a tunneling window between said first insulator region overlying said source region and said second insulator region adjacent said source region.

15. The memory cell of claim 1, wherein a first edge of said floating gate conductor is insulatively disposed between portions of said merged pass gate conductor and said control gate conductor and a second edge of said floating gate conductor is insulatively disposed between portion of said control gate conductor and a merged pass gate conductor of an adjacent memory cell.

16. The memory cell of claim 8, further including:
a first insulator region overlying said drain region;
a second insulator region overlying said source region;
a third insulator region adjacent said drain region remote from said channel area; and
a fourth insulator region adjacent said source region remote from said channel area.

17. The memory cell of claim 16, further including a tunneling window between said second insulator region overlying said source region and said fourth insulator region adjacent said source region.

18. The memory cell of claim 16, in which said first control gate conductor extends over a portion of said first insulator region and a portion of said third insulator region.

19. The memory cell of claim 16, in which said floating gate conductor extends over said second insulator region and a portion of said fourth insulator region.

20. The memory cell of claim 8, wherein a first edge of said floating gate conductor is insulatively disposed between portions of said first control gate conductor and said second control gate conductor and a second edge of said floating gate conductor is insulatively disposed between portions of said second control gate conductor and a first control gate conductor of an adjacent memory cell.

21. The array of claim 9, further including for each cell, a tunneling window between said second insulator region and a third insulator region formed between the source region of an associated column and the drain region of an adjacent column.

22. The array of claim 9, wherein for each cell, a first edge of said floating gate is insulatively disposed between portions of said merged pass gate and said control gate and a second edge of said floating gate is insulatively disposed between portions of said control gate and a merged pass gate of an adjacent memory.

23. First and second memory cells, formed at a face of a semiconductor layer of a first conductivity type, each memory cell comprising:
a source region of a second conductivity type opposite that of said first conductivity type, formed at said face;
a drain region of said second conductivity type formed at said face and spaced from said source region by a channel area;
a first control gate conductor overlying said face; and
a floating gate conductor, a first portion of said floating gate conductor insulatively adjacent a portion of said first control gate conductor, a second portion of said floating gate conductor insulatively adjacent at least a portion of said channel area between said source region and said drain region;
a second control gate conductor contacting said first control gate conductors of said first and second memory cells and disposed insulatively adjacent said floating gate conductors of said first and second memory cells;
a first edge of said floating gate conductor of said first memory cell insulatively disposed between portions of said first control gate conductor of said first memory cell and said second control gate conductor and a second edge of said floating gate conductor of said first memory cell insulatively disposed between portions of said second control gate conductor and said first control gate conductor of said second memory cell.

24. The first and second memory cells of claim 23, in which for each memory cell, said second portion of said floating gate conductor is insulatively adjacent the entire length of said channel area.

25. The first and second memory cells of claim 23, in which for each memory cell, said first control gate conductor is insulatively adjacent a first portion of said channel area and said second portion of said floating gate conductor is insulatively adjacent a second portion of said channel area.

* * * * *